United States Patent
Rudd, III

(10) Patent No.: US 7,262,595 B2
(45) Date of Patent: Aug. 28, 2007

(54) SEGMENTED CORE FOR AN INDUCTIVE PROXIMITY SENSOR

(75) Inventor: Robert Edward Rudd, III, Panton, VT (US)

(73) Assignee: Simmonds Precision Products, INc., Vergennes, VT (US)

( * ) Notice: Subject to any disclaimer, the term of this patent is extended or adjusted under 35 U.S.C. 154(b) by 0 days.

(21) Appl. No.: 11/190,432

(22) Filed: Jul. 27, 2005

(65) Prior Publication Data
US 2007/0024275 A1    Feb. 1, 2007

(51) Int. Cl.
*G01B 7/14* (2006.01)
*G01R 33/00* (2006.01)

(52) U.S. Cl. ............................ 324/207.26; 324/207.15; 324/207.16; 324/234

(58) Field of Classification Search ........... 324/207.16, 324/207.26, 207.15, 234
See application file for complete search history.

(56) References Cited

U.S. PATENT DOCUMENTS

| | | | |
|---|---|---|---|
| 4,943,793 A * | 7/1990 | Ngo et al. .................... | 336/83 |
| 5,192,862 A | 3/1993 | Rudd, III | |
| 5,334,831 A | 8/1994 | Maurice | |
| 5,561,375 A | 10/1996 | Porcher | |
| 5,814,986 A * | 9/1998 | Goskowicz et al. ... | 324/207.26 |
| 5,823,309 A * | 10/1998 | Gopalswamy et al. ..... | 192/21.5 |
| 5,942,893 A | 8/1999 | Terpay | |
| 6,424,145 B1 | 7/2002 | Woolsey et al. | |
| 6,801,113 B2 | 10/2004 | Nakazaki et al. | |
| 7,015,395 B2 * | 3/2006 | Goldsworthy et al. .. | 174/102 R |

* cited by examiner

*Primary Examiner*—Reena Aurora
(74) *Attorney, Agent, or Firm*—Alston & Bird LLP

(57) ABSTRACT

An inductive proximity sensor for sensing the presence of target based on a change of inductance in the sensor. The sensor includes a coil and a core formed of a permeable material so as to form an electromagnetic field when the coil is electrically driven. The core has a base, a central post, an outer wall, and at least one slot. The central post extends distally from the base and through the coil and defines a distal end. The outer wall extends distally from the base and around the coil and also defines a distal end. The slot or slots are for enhancing the performance of the sensor by reducing eddy current losses in the core. Each slot extends at least partially along a path defined from the distal end of the outer wall to the base and from the base to the distal end of the central post.

17 Claims, 4 Drawing Sheets

SEGMENTED CORE FOR AN INDUCTIVE PROXIMITY SENSOR

FIELD OF THE INVENTION

The present invention generally relates to inductive proximity sensors and, more particularly, to variable reluctance-type inductive proximity sensors and methods of detecting the proximity of an object.

BACKGROUND OF THE INVENTION

Proximity sensors have many different applications in many different industries. In the aerospace industry, for example, proximity sensors can be used within an aircraft to detect the position of various movable components. More specifically, proximity sensors can be used to detect the position of aircraft landing gear, landing gear doors, spoilers, passenger doors, and/or cargo doors. In this regard, such proximity sensors can be used to indicate aircraft conditions such as weight-on-wheels, landing gear up/down, doors open/closed, and/or spoilers stowed/not stowed.

As will be appreciated, proximity sensors can be configured to detect the presence of an object in accordance with a number of different techniques including, for example, variable reluctance, eddy current loss, saturated core, and the Hall effect. In general, a sensor includes a core of a highly-permeable metal and an inductive coil. While the shape of the core can vary, in one typical configuration, the core can comprise a central post and an outer cylindrical wall. The coil is wrapped around the central post and is contained within the outer cylindrical wall.

In accordance with a variable-reluctance proximity detection technique, an external AC current source drives the coil of the proximity sensor to form an electromagnetic circuit with the core. When a permeable and/or conductive object is brought or otherwise moved into the alternating magnetic field caused by the electromagnetic circuit, the reluctance (i.e., air gap resistance) between the object and the proximity sensor changes, or more particularly, decreases. As the reluctance decreases, the inductance of the coils increases. This increase can then be measured to thereby detect the proximity of the object.

The effective range of the sensor is dependent on the amount of change in inductance created by the object as it approaches. The greater the change the faster the sensor can detect the object both in sense of distance between the object and sensor and the time required to measure the inductance difference.

However, eddy currents are created in the core by the electromagnetic circuit. The eddy currents resist change in the magnetic field. This resistance to change reduces the inductance, and thus the signal, caused by the object entering the magnetic field. Furthermore, the eddy currents also provide a resistive loss to the AC circuit. Both the decrease in inductance and increase in resistance contribute to reduce bandwidth of the circuit and increase the time required to make a measurement. Conversely, the lost signal could be used to sense the object at a greater distance.

BRIEF SUMMARY OF THE INVENTION

The present invention addresses the above needs and achieves other advantages by providing an improved proximity sensor having a segmented magnetic core to enhance the range and measurement cycle of the sensor. Generally, the proximity sensor includes at least one coil and a core. The core defines at least one slot. Advantageously, the slot or slots reduce eddy current losses by disrupting the flow of eddy currents within the core. Segmenting the core can be accomplished in several ways and therefore the invention has numerous embodiments.

For example in one embodiment, the present invention includes an inductive proximity sensor for sensing at least the presence of a target adjacent to the sensor based on a change of inductance in the sensor relative to the absence of the target adjacent the sensor. The coil is capable of being electrically driven to generate a magnetic field. The core is formed of a permeable material so as to form an electromagnetic field when the coil is electrically driven. The core defines a base, a central post, an outer wall, and at least one slot. The central post extends distally from the base and through the coil and defines a distal end. The outer wall extends distally from the base and around the coil and also defines a distal end. Each slot extends at least partially along a path defined from the distal end of the outer wall to the base and from the base to the distal end of the central post. The slot or slots enhance the performance of the sensor by reducing eddy current losses in the core.

The number of slots may vary depending on the embodiment. For example purposes and not as a limitation, the core may define four or eight slots. Also, depending on the embodiment, the degree to which each slot extends along the path defined from the distal end of the outer wall to the base and from the base to the distal end of the central post may vary. Again for example purposes and not as a limitation, at least one slot may fully extend along the path. The depth of which each slot extends into the permeable material of the core may vary according to the embodiment. For example, in one embodiment each slot may extend through the outer wall. In another embodiment, each slot may extend through the base. Conversely, in another embodiment each slot may extend only partially into the central post.

In another aspect, the central post may also include a solid distal area. The solid distal area advantageously maintains some of the cross-sectional area, and thus the magnetic path area, reduced by the slot or slots in the central post.

In yet another embodiment of the present invention, the sensor includes at least one coil and a laminated core. In general, the core is round and includes two or more pie-shaped sections and one or more insulating layers. Each section has a base, a central post, and an outer wall. The central post extends distally from the base and through the coil and defines a distal end. Similarly, the outer wall extends distally from the base and around the coil and defines a distal end. The one or more insulating layers separate the adjacent pie-shaped sections from each other. The pie-shaped sections and insulating layers together form an integrated laminated core. The insulating layers enhance the performance of the sensor by disrupting the flow of eddy current within the core.

The number of pie-shaped sections may vary depending on the embodiment. For example purposes and not as a limitation, the core may define four or eight pie shaped sections.

In another aspect of the present invention, the sensor may further include a housing and an end plate. The housing and end plate, together, enclose the core and coil.

The present invention has several advantages. The slots in the core reduce eddy current losses and thus enhance the cycle time and range of the sensor. The solid distal area on the central post limits the lost cross-section area caused by the slots. Similarly, the insulating layers in the laminated core reduce eddy currents losses and thus enhance the cycle time and range of the sensor.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 6a is a perspective view of yet another embodiment of the present invention having a core defining 4 pie-shaped sections, wherein one pie-shaped section is removed; and FIG. 6b is a perspective view of the pie-shaped section removed from the core in FIG. 6a.

DETAILED DESCRIPTION OF THE INVENTION

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
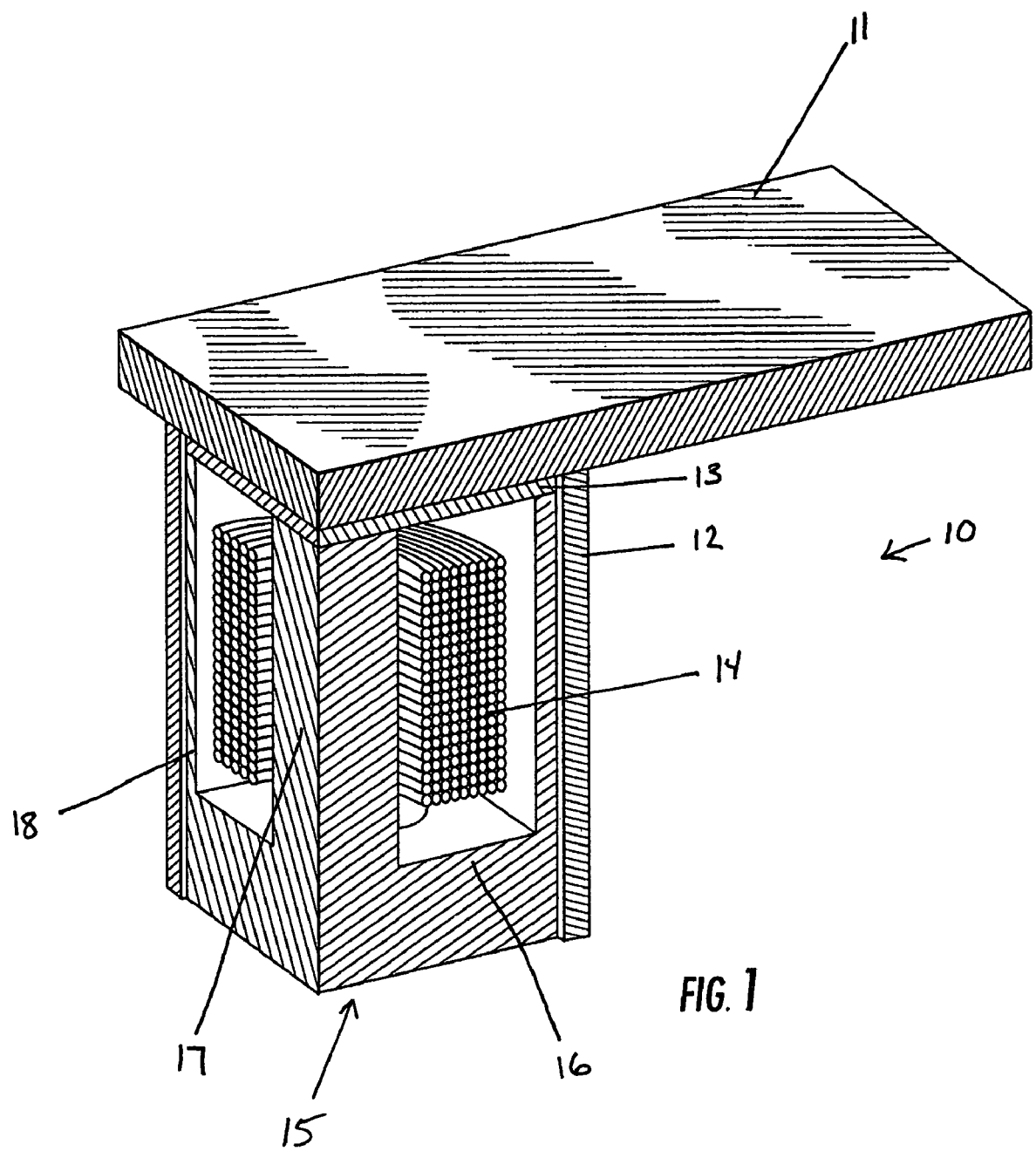
FIG. 1 is a quadrant perspective view of the sensor according to one embodiment of the present invention.
Figure 2:
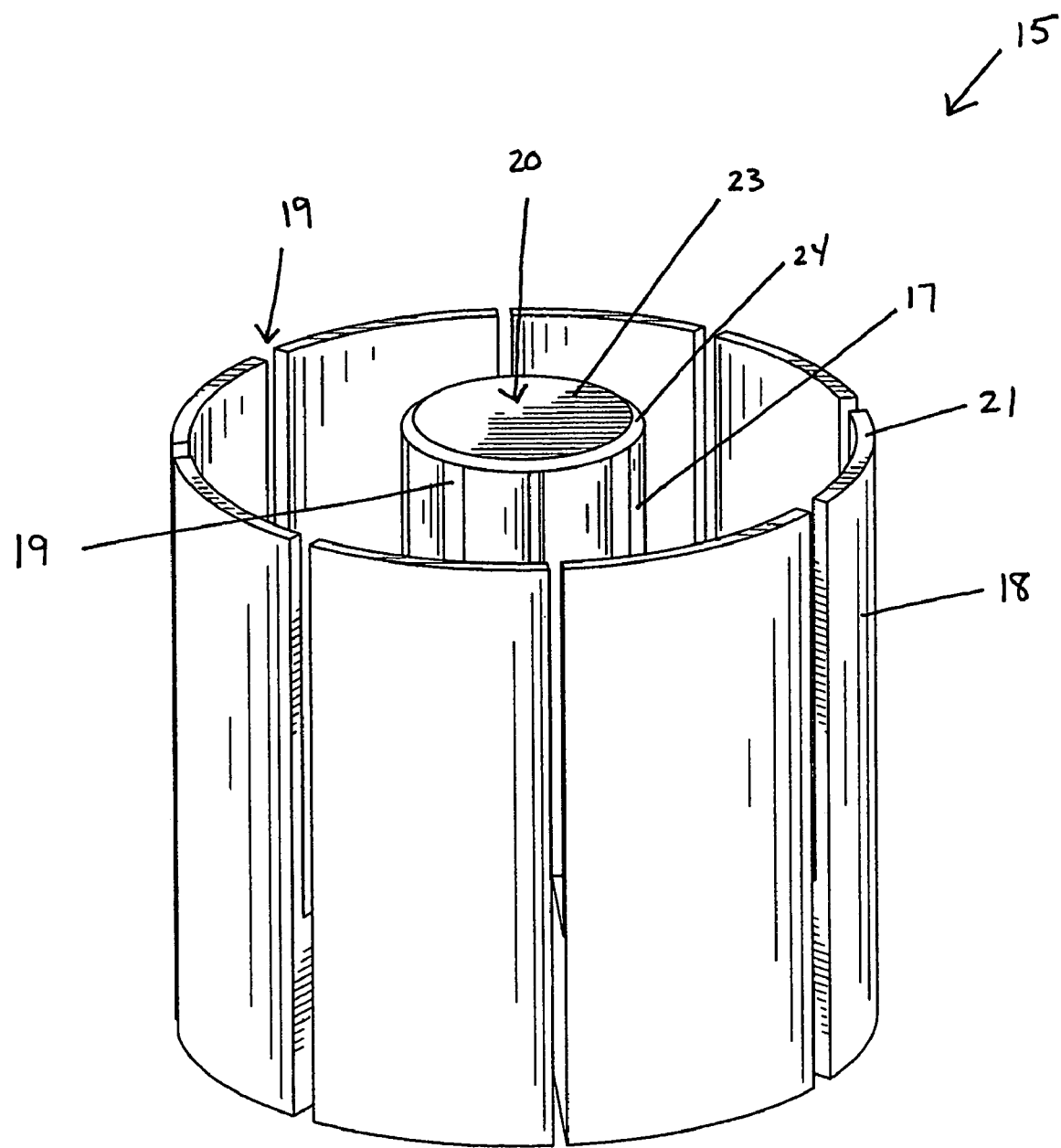
FIG. 2 is a perspective view of one embodiment of the present invention, wherein the core defines 8 slots.
Figure 3:
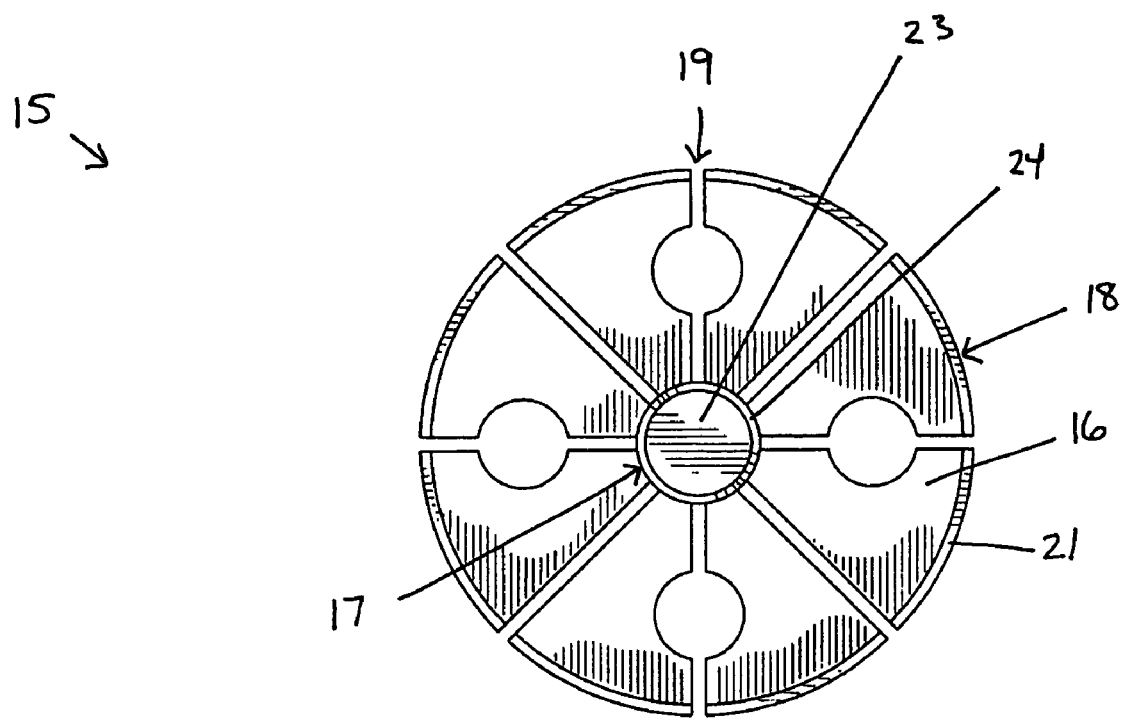
FIG. 3 is a top view of the core illustrated in FIG. 2.
Figure 4:
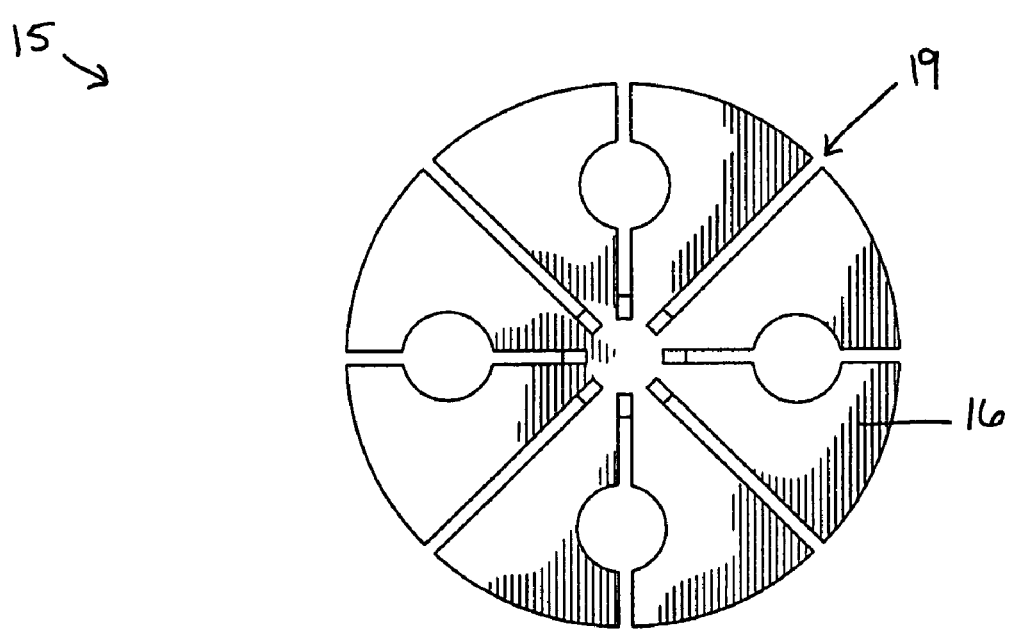
FIG. 4 is a bottom view of the core illustrated in FIG. 2.

In general, as shown in the figures, the present invention includes an inductive proximity sensor 10 for sensing at least the presence of a target 11 adjacent to the sensor 10 based on a change of inductance in the sensor 10 relative to the absence of the target 11 adjacent to the sensor 10. According to one embodiment as shown in FIG. 1, the sensor 10 includes a coil 14, and a core 15. The coil 14 is wrapped around a central post 17 of the core 15 and within an outer wall 18 of the core 15. The core 15 is made of a permeable material and, as best seen in FIGS. 2 through 4, defines a base 16, the central post 17, the outer wall 18, and at least one slot 19 in the permeable material. The central post 17 extends distally from the base 16 and through the coil 14 and defines a distal end 20. The outer wall 18 extends distally from the base 16 and around the coil 14 and defines a distal end 21. In operation, the coil 14 is capable of being electrically driven by an external AC current source in order to create an alternating magnetic field through and around the core 15. As illustrated, the base 16 may define a number of openings to provide a path for an electrical connection between the coil 14 and the current source.

The slot or slots 19 in the permeable material extend at least partially along a path defined from the distal end 21 of the outer wall 18 to the base 16 and from the base 16 to the distal end 20 of the central post 17. The slot or slots 19 are for enhancing the performance of the sensor 10 by reducing eddy current losses in the core 15. While not intending to be bound by any particular theory, it is believed that the slots 19 disrupt the eddy currents that would be induced in the core 15, by the magnetic field through and around the core 15, and would oppose the magnetic field. In particular, without the slots 19, the eddy currents would circulate around the longitudinal axis of the core 15, rising approximately linearly from zero at the axis. The slots 19 are generally perpendicular to the eddy current paths in conventional proximity sensors and thus prevent or at least disrupt the eddy currents and increase the inductance in the sensor 10.

Figure 5:
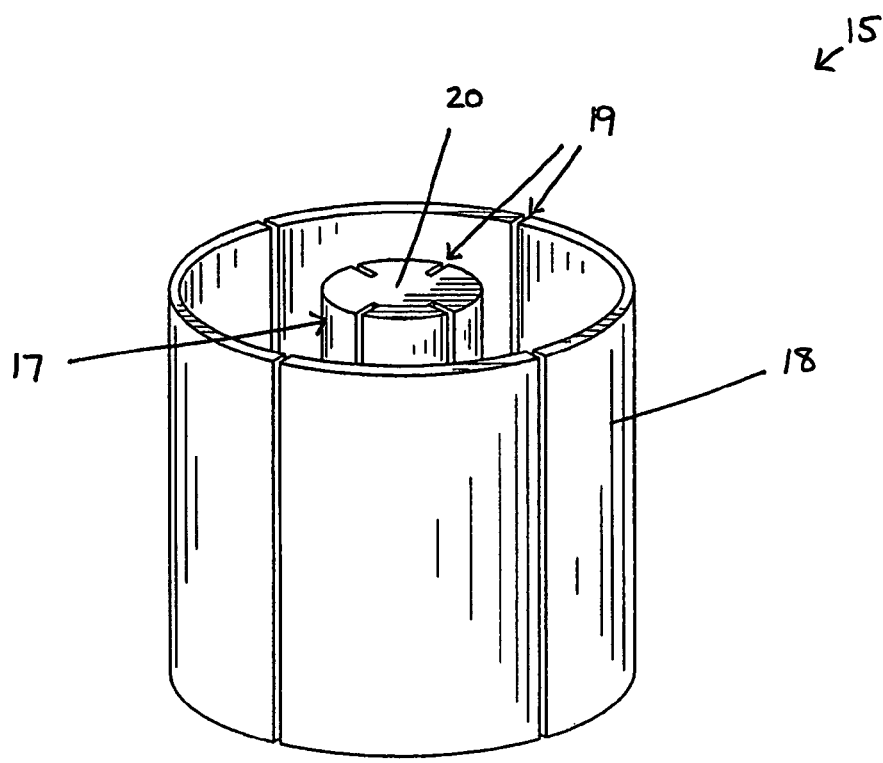
FIG. 5 is a perspective view of another embodiment of the present invention, wherein the core defines 4 slots.

The number of slots 19 defined in the core 15 may vary. For example purposes only and not as a limitation, the core 15 may define four, as shown in FIG. 5, or eight slots 19, as shown in FIGS. 2 through 4. Also the degree in which each slot 19 extends along the path defined between the two distal ends 20, 21 may vary. For example, a slot 19 may fully extend along the entire path, as in FIG. 5. Alternatively the slots 19 may extend entirely along the outer wall 18 and base 16 portions of the path but extend short of the distal end 20 of the central post 17 along that portion of the path, as best seen in FIG. 3 and 4 and for reasons explained further below. As illustrated, the portion of the slots 19 along the outer wall 18 and base 16 may be through-slot portions, i.e. that portion of the slot 19 exists through the entire depth of the material in those areas. However the slot 19 does not need to extend entirely through the thickness of the outer wall 18 or the base 16. It is preferred that the portion of the slot 19 along the central post 17 only partially extend into the material of the central post 17. This allows for the core 15 to remain integrated. Moreover, leaving the center of the post 17 solid has a minimal effect on eddy currents when the slots 19 are disrupting the eddy currents away from the center. The center of the central post 17 is also the longitudinal axis of the core 15. As stated above, the eddy currents are weakest and approaching zero near and at the longitudinal axis.

The width of each slot 19 is relatively thin. Limiting the width of each slot 19 is advantageous for mechanical considerations such as maintaining the stiffness and strength of the core 15. Furthermore, limiting the width of each slot 19 is also advantageous for electromagnetic considerations. It is preferable to limit the amount of permeable material that is displaced by the slots 19 because the amount of material is directly proportional to the reluctance in the sensor 10. Moreover, the widths of the slots 19 are not significant to the slots' 19 capability to disrupt the eddy currents. In theory, any break in the permeable material is significant enough to alter or disrupt the flow of an eddy current. One practical consideration for the width of each slot 19 is the capability of the machining or manufacturing process for forming the slot or slots 19 in the core 15. For example purposes only, the slot or slots 19 may be formed by a milling tool. According to one embodiment, the width of each slot 19 is approximately 0.020 inches.

Even by limiting the width of each slot 19, the portions of the slots 19 in the central post 17 do have a compromising effect on the inductance in the sensor 10. Although the slots 19 reduce the eddy current losses, they also reduce the cross-sectional area of the central post 17, and thus the magnetic path area. As such, the post 17 may be formed without any slots. The central post 17 of the core 15 with the surrounding coil 14 is similar to a solenoid. For a solenoid, inductance is directly proportional to the permeability of the core material and cross-sectional area of the post 17.

In some embodiments and as shown in FIG. 2 as compared to FIG. 5, the core 15 may also have a solid foot or distal area 23. According to these embodiments, the slots 19 do not extend to the distal end 20 of the central post 17. The solid distal area 23 extends and defines a thickness from the end of the slots 19 to the distal end 20 of the central post 17. In theory, the thickness of the solid distal area 23 is a compromise of increasing the magnetic path area versus increasing the eddy current losses. As shown, the solid distal area 23 may have a beveled edge 24. The beveled edge 24 reduces the thickness of the solid distal area 23 as it extends away from the longitudinal axis of the core 15, where eddy currents would be the greatest. For example purposes only and not as limitation, the solid distal area 23 may have a thickness between approximately 0.01 inches and 0.02 inches. The beveled edge 24 may be a 45 degree bevel. The distance from the distal end 20 to the base 16 may be between approximately 0.330 inches to 0.340 inches.

Figures 6A, 6B:
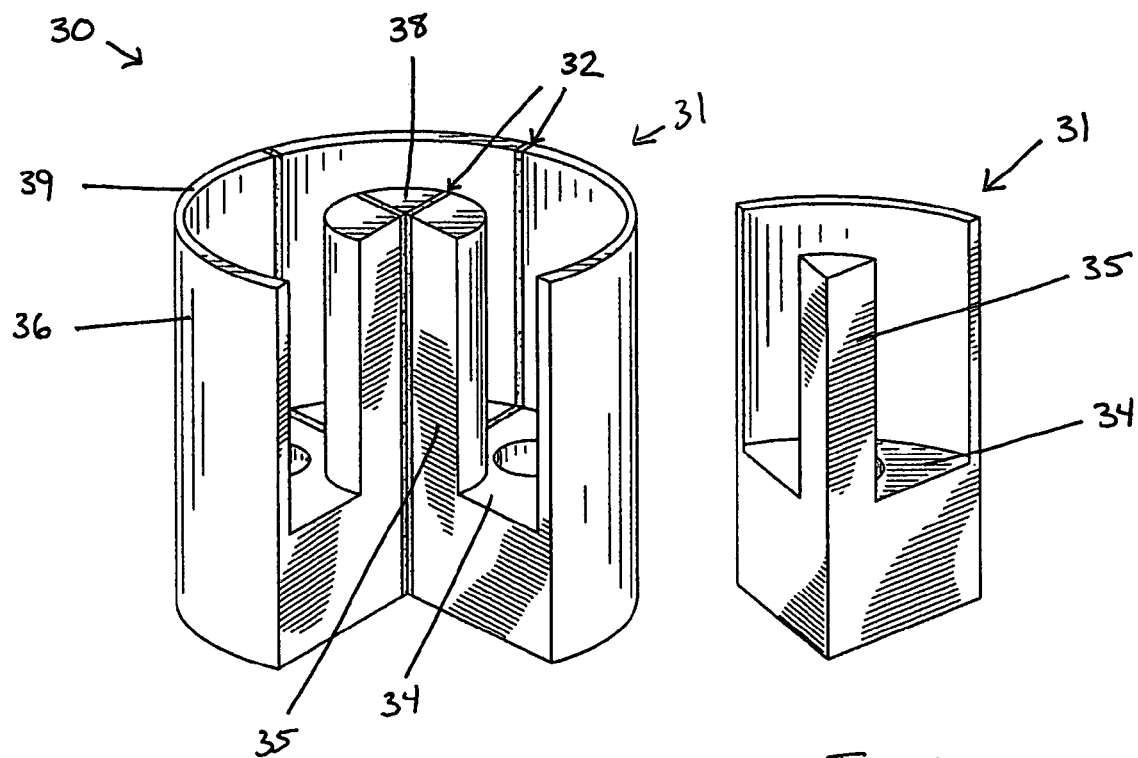

In another embodiment of the present invention, the sensor 10 has a laminated core 30 and a coil 14. As illustrated in FIG. 6, the core 30 is generally round and defines two or more pie-shaped sections 31 and one or more insulating layers 32. Each pie-shaped section 31 includes a base 34, a central post 35, and an outer wall 36. The central post 35 extends distally from the base 34 and through the coil 14 and defines a distal end 38. Similarly, the outer wall 36 extends distally from the base 34 and around the coil 14 and defines a distal end 39. The one or more insulating layers 32 separate the adjacent pie-shaped sections 31 from each other. The pie-shaped sections 31 and insulating layers 32 together form an integrated laminated core 30 for enhancing the performance of the sensor 10 by reducing eddy current losses in the core 30.

The number of pie-shaped sections 31 may vary depending on the embodiment. For example purposes and not as a limitation, the core 30 may define four, as illustrated, or eight pie shaped sections 31.

As stated above, the adjacent pie-shaped sections 31 are separated by at least one insulating layer 32. Preferably the insulating layer or layers 32 is an adhesive that can bind the pie-shaped sections 31 together.

Again, while not intending to be bound by any particular theory, it is believed that the insulating layers 32 disrupt the eddy currents that would be induced in the core 30 and oppose the magnetic field. Similar to the slots 19 discussed above, without the insulating layers 32, the eddy currents would circulate around the longitudinal axis of the core 30, generally rising from zero at the axis. The insulating layers 32 are generally perpendicular to the anticipated eddy current paths and thus prevent or at least disrupt the eddy currents and increase the inductance in the sensor 10.

In another aspect of the present invention, the sensor 10 may also have a housing 12 and end plate 13. Together the housing 12 and end plate 13 provide an overall enclosure for the sensor 10, as best shown in FIG. 1.

The present invention has several advantages. The slots 19 in the core 15 reduce eddy current losses and thus enhance the cycle time and range of the sensor 10. The solid distal area 23 of the central post 17 compensates for some of the lost cross-section area caused by the slot or slots 19. Similarly, the insulating layers 32 in the laminated core 30 reduce eddy currents losses and thus enhance the cycle time and range of the sensor 10.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An inductive proximity sensor for sensing at least the presence of a target adjacent to the sensor based on a change of inductance in the sensor relative to the absence of a target adjacent the sensor, said sensor comprising:
   at least one coil capable of being electrically driven to generate a magnetic field and;
   a core formed of a permeable material so as to form an electromagnetic field when the coil is electrically driven, the core defining,
   a base,
   a central post extending distally from the base and through the coil and defining a distal end,
   an outer wall extending distally from the base and around the coil and defining a distal end, and
   at least one slot in the permeable material for enhancing the performance of the sensor by reducing eddy current losses in the core, wherein each slot extends at least partially along a path defined from the distal end of the outer wall to the base and partially from the base to the distal end of the central post.

2. The sensor of claim 1, wherein the core further defines four slots.

3. The sensor of claim 1, wherein the core further defines eight slots.

4. The sensor of claim 1, wherein a portion of each slot along the outer wall extends completely through the outer wall.

5. The sensor of claim 1, wherein a portion of each slot along the base extends completely through the base.

6. The sensor of claim 1, wherein the central post has a solid distal area.

7. The sensor of claim 1, further comprising a housing and an end plate that together enclose the coil and the core.

8. An inductive proximity sensor for sensing at least the presence of a target adjacent to the sensor based on a change of inductance in the sensor relative to the absence of a target adjacent the sensor, said sensor comprising:
   at least one coil capable of being electrically driven to generate a magnetic field and;
   a core formed of a permeable material so as to form an electromagnetic field when the coil is electrically driven, the core defining,
   a base,
   a central post extending distally from the base and through the coil and defining a distal end,
   an outer wall extending distally from the base and around the coil and defining a distal end, and
   at least one slot in the permeable material for enhancing the performance of the sensor by reducing eddy current losses in the core, wherein each slot extends at least partially along a path defined from the distal end of the outer wall to the base and from the base to the distal end of the central post, and wherein at least one slot fully extends along the path defined from the distal end of the outer wall to the base and from the base to the distal end of the central post.

9. An inductive proximity sensor for sensing at least the presence of a target adjacent to the sensor based on a change of inductance in the sensor relative to the absence of a target adjacent the sensor, said sensor comprising:
   at least one coil capable of being electrically driven to generate a magnetic field and;
   a core formed of a permeable material so as to form an electromagnetic field when the coil is electrically driven, the core defining,
   a base, a central post extending distally from the base and through the coil and defining a distal end, an outer wall extending distally from the base and around the coil and defining a distal end, and at least one slot in the permeable material for enhancing the performance of the sensor by reducing eddy current losses in the core, wherein each slot extends at least partially along a path defined from the distal end of the outer wall to the base and from the base to the distal end of the central post, and wherein at least a portion of each slot extends partially through the central post.

10. A core formed of a permeable material so as to form an electromagnetic field when a coil wrapped around the core is electrically driven as part of an inductive proximity sensor, said core comprising:

a base, a central post extending distally from the base and through the coil and defining a distal end, an outer wall extending distally from the base and around the coil and defining a distal end, and at least one slot defined in the permeable material for enhancing the performance of the sensor by reducing eddy current losses in the core, wherein each slot extends at least partially along a path defined from the distal end of the outer wall to the base and partially from the base to the distal end of the central post.

11. The core of claim 10, further comprising four slots.

12. The core of claim 10, further comprising eight slots.

13. The core of claim 10, wherein a portion of each slot along the outer wall extends completely through the outer wall.

14. The core of claim 10, wherein a portion of each slot along the base extends completely through the base.

15. The core of claim 10, wherein the central post has a solid distal area.

16. A core formed of a permeable material so as to form an electromagnetic field when a coil wrapped around the core is electrically driven as part of an inductive proximity sensor, said core comprising:

a base, a central post extending distally from the base and through the coil and defining a distal end, an outer wall extending distally from the base and around the coil and defining a distal end, and at least one slot defined in the permeable material for enhancing the performance of the sensor by reducing eddy current losses in the core, wherein each slot extends at least partially along a path defined from the distal end of the outer wall to the base and from the base to the distal end of the central post and wherein at least one slot fully extends along the path defined from the distal end of the outer wall to the base and from the base to the distal end of the central post.

17. A core formed of a permeable material so as to form an electromagnetic field when a coil wrapped around the core is electrically driven as part of an inductive proximity sensor, said core comprising:

a base, a central post extending distally from the base and through the coil and defining a distal end, an outer wall extending distally from the base and around the coil and defining a distal end, and at least one slot defined in the permeable material for enhancing the performance of the sensor by reducing eddy current losses in the core, wherein each slot extends at least partially along a path defined from the distal end of the outer wall to the base and from the base to the distal end of the central post and wherein a portion of each slot along the central post extends partially through the central post.

* * * * *